(12) United States Patent
Desai et al.

(10) Patent No.: US 11,837,447 B2
(45) Date of Patent: Dec. 5, 2023

(54) WORKPIECE PROCESSING APPARATUS WITH PLASMA AND THERMAL PROCESSING SYSTEMS

(71) Applicants: Beijing E-Town Semiconductor Technology Co., Ltd., Beijing (CN); Mattson Technology, Inc., Fremont, CA (US)

(72) Inventors: Dixit Desai, Pleasanton, CA (US); Alex Wansidler, Ulm (DE); Dieter Hezler, Lonsee-Halzhausen (DE); Joseph Cibere, Burnaby (CA); Rolf Bremensdorfer, Bibertal (DE); Pete Lembesis, Boulder Creek, CA (US); Michael Yang, Palo Alto, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 393 days.

(21) Appl. No.: 17/242,383

(22) Filed: Apr. 28, 2021

(65) Prior Publication Data
US 2022/0189747 A1 Jun. 16, 2022

(30) Foreign Application Priority Data
Dec. 14, 2020 (CN) .......................... 202011464458.4

(51) Int. Cl.
*H01J 37/32* (2006.01)

(52) U.S. Cl.
CPC ... *H01J 37/32724* (2013.01); *H01J 37/32119* (2013.01); *H01J 37/32449* (2013.01);
(Continued)

(58) Field of Classification Search
CPC .......... H01J 37/32724; H01J 37/32119; H01J 37/32449; H01J 37/32651; H01J 2237/20214
See application file for complete search history.

(56) References Cited

U.S. PATENT DOCUMENTS

| 6,503,562 B1 | 1/2003 | Saito et al. |
| 6,782,843 B2 | 8/2004 | Kinnard et al. |
| (Continued) | | |

FOREIGN PATENT DOCUMENTS

| CN | 1886641 | 12/2006 |
| CN | 104704613 | 6/2015 |
| (Continued) | | |

*Primary Examiner* — Wei (Victor) Y Chan
(74) *Attorney, Agent, or Firm* — Dority & Manning, P.A.

(57) ABSTRACT

An apparatus for combining plasma processing and thermal processing of a workpiece is presented. The apparatus includes a processing chamber, a plasma chamber separated from the processing chamber disposed on a first side of the processing chamber, and a plasma source configured to generate a plasma in the plasma chamber. A quartz workpiece support is disposed within the processing chamber, the workpiece support configured to support a workpiece. One or more radiative heat sources configured to heat the workpiece are disposed on a second and opposite side of the first side of the processing chamber. A dielectric window is disposed between the workpiece support and the one or more heat sources. In addition, the apparatus includes a temperature measurement system configured to obtain a temperature measurement indicative of a temperature of the workpiece.

20 Claims, 10 Drawing Sheets

(52) U.S. Cl.
CPC .................. *H01J 37/32651* (2013.01); *H01J 2237/20214* (2013.01)

(56) References Cited

U.S. PATENT DOCUMENTS

| | | |
|---|---|---|
| 7,112,763 B2 | 9/2006 | Hunter et al. |
| 7,316,969 B2 | 1/2008 | Hauf et al. |
| 7,616,872 B2 | 11/2009 | Camm et al. |
| 8,296,091 B2 | 10/2012 | Timans |
| 9,180,550 B2 | 11/2015 | Kusuda |
| 9,627,244 B2 | 4/2017 | Camm et al. |
| 9,677,944 B2 | 6/2017 | Gurary et al. |
| 10,159,113 B2 | 12/2018 | Möench et al. |
| 11,062,910 B2 | 7/2021 | Yang et al. |
| 11,062,912 B2 | 7/2021 | Ma |
| 11,101,142 B2 | 8/2021 | Timans |
| 2018/0166296 A1* | 6/2018 | Ma .................... H01J 37/32422 |
| 2019/0182915 A1 | 6/2019 | Hirochi et al. |

FOREIGN PATENT DOCUMENTS

| | | |
|---|---|---|
| CN | 104871299 | 8/2015 |
| CN | 106575618 A | 4/2017 |
| CN | 109786279 A | 5/2019 |
| JP | 2002155364 | 5/2002 |
| JP | 2017009450 | 1/2017 |

\* cited by examiner

WORKPIECE PROCESSING APPARATUS WITH PLASMA AND THERMAL PROCESSING SYSTEMS

FIELD

The present disclosure relates generally to semiconductor processing equipment, such as equipment operable to perform plasma processing and thermal processing of a workpiece.

BACKGROUND

Plasma processing is widely used in the semiconductor industry for materials deposition, materials modification, materials removal, and related processing of semiconductor wafers and other substrates. Plasma sources (e.g., inductively-coupled plasma source, capacitively-coupled plasma source, microwave plasma source, electron cyclotron resonance plasma source, etc.) are often used for plasma processing to produce high density plasma and reactive species for processing substrates. Reactive species in plasma can include positively and negatively charged ions, negatively charged electrons, charge-neutral radicals and other energetic neutral particles. In order to avoid charge damage of materials, charged species from a plasma generated in a remote plasma chamber can be filtered out while charge neutral radicals and other energetic neutral particles can pass through a separation grid into a processing chamber to treat a substrate, such as a semiconductor wafer.

Thermal processing is also used for processing of semiconductor wafers and other substrates. Generally, a thermal processing chamber as used herein refers to a device that heats workpieces, such as semiconductor workpieces. Such devices can include a support plate for supporting one or more workpieces and an energy source for heating the workpieces, such as heating lamps, lasers, or other heat sources. During heat treatment, the workpiece(s) can be heated under a controlled ambient.

Many thermal treatment processes require a workpiece to be heated over a range of temperatures so that various chemical and physical transformations can take place on the workpiece. During rapid thermal processing, for instance, workpieces can be heated by an array of lamps to temperatures from about 300° C. to about 1,200° C. over time durations that are typically less than a few minutes. During these processes, a primary goal can be to reliably and accurately measure and control the temperature of the workpiece according to a variety of desired heating schemes.

In process flow of semiconductor wafers and other substrates, there can be sequential plasma processing and thermal processing steps. Instead of two separate processing apparatuses for plasma processing and thermal processing, a single processing apparatus capable of performing both plasma processing and thermal processing of the workpiece are desirable for reducing manufacturing cycle time and manufacturing cost. In addition, in processing flow of semiconductor and other substrates, processing steps can require simultaneous plasma processing and thermal processing of the workpiece. Thus, a processing apparatus capable of performing both plasma processing and thermal processing of the workpiece is desired.

SUMMARY

Aspects and advantages of embodiments of the present disclosure will be set forth in part in the following description, or may be learned from the description, or may be learned through practice of the embodiments.

Example aspects of the present disclosure are directed to a processing apparatus for processing a workpiece. The processing apparatus includes a processing chamber; a plasma chamber separated from the processing chamber disposed on a first side of the processing chamber; a gas delivery system configured to deliver one or more process gases to the plasma chamber; a plasma source configured to generate a plasma from the one or more process gases in the plasma chamber; a workpiece support disposed within the processing chamber, the workpiece support configured to support a workpiece, the workpiece support comprising quartz, wherein a back side of the workpiece faces the workpiece support; one or more radiative heating sources configured on a second and opposite side of the first side of the processing chamber, the one or more radiative heating sources configured to heat the workpiece from the back side of the workpiece; a dielectric window disposed between the workpiece support and the one or more radiative heating sources; a workpiece temperature measurement system configured at a temperature measurement wavelength range to obtain a temperature measurement indicative of a temperature of the workpiece; and a workpiece temperature control system configured to control power supply to the radiative heating sources.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
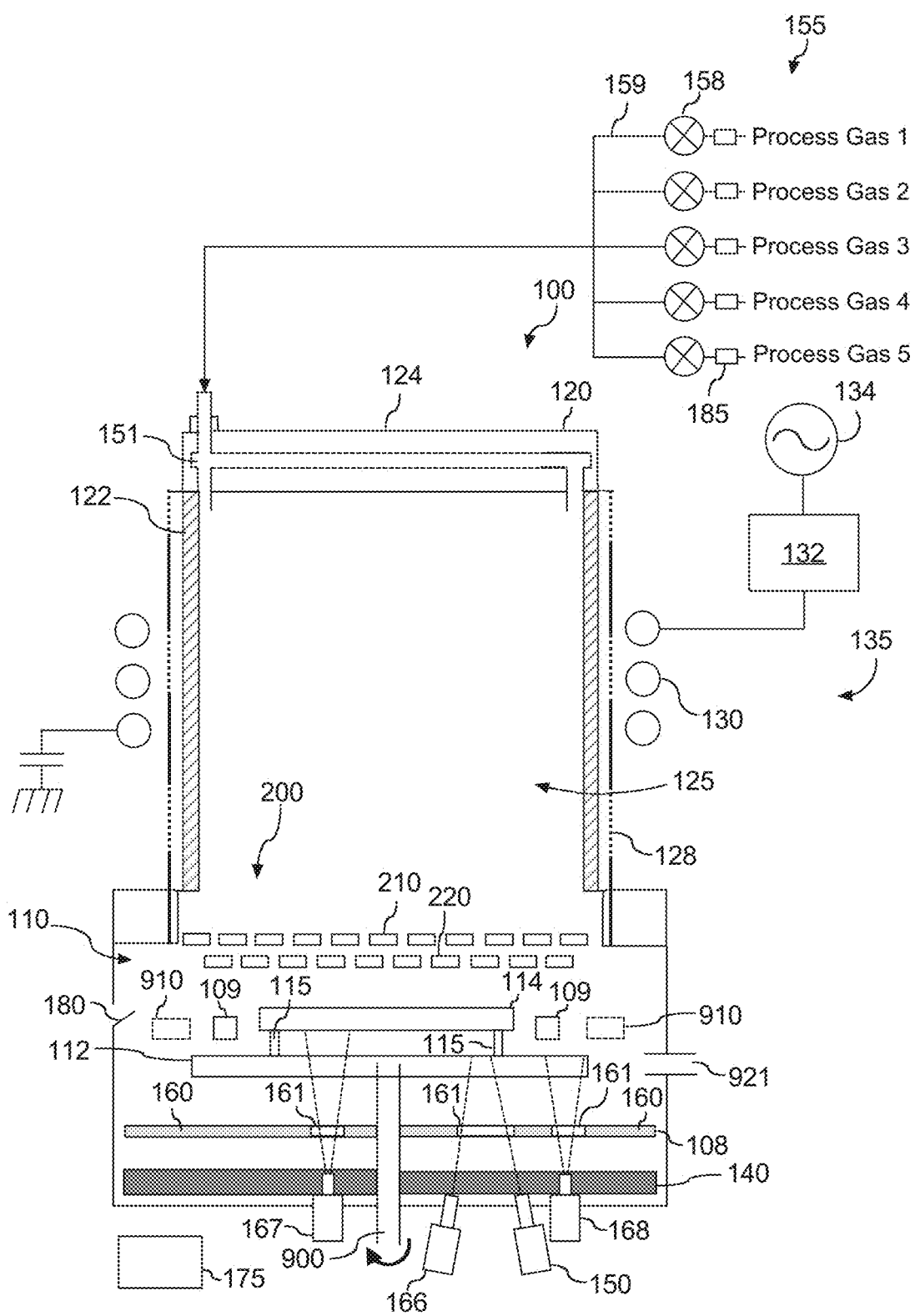
FIG. 1 depicts an example processing system according to example aspects of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Various workpiece processing treatments can require plasma treatment, heat treatment, or both. Typically, plasma treatments and heat treatments, such as rapid thermal processing, must be performed in different devices or processing chambers in order to accurately control process parameters. Furthermore, it can be difficult to obtain accurate workpiece temperature measurements of workpieces during plasma and thermal processing.

Accordingly, aspects of the present disclosure provide a number of technical effects and benefits. For instance, the processing apparatus provided herein allows for the ability to conduct both plasma and thermal treatments in the same processing chamber, thus reducing manufacturing cycle time, manufacturing cost and overall apparatus footprint in semiconductor processing fabs. Furthermore, the apparatus provided herein includes a temperature measurement system, capable of accurately determining workpiece temperature at both the center and perimeter of the workpiece during processing.

Variations and modifications can be made to these example embodiments of the present disclosure. As used in the specification, the singular forms "a," "and," and "the" include plural referents unless the context clearly dictates otherwise. The use of "first," "second," "third," etc., are used as identifiers and are not necessarily indicative of any ordering, implied or otherwise. Example aspects may be discussed with reference to a "substrate," "workpiece," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value.

FIG. 1 depicts an example processing apparatus 100 that can be used to perform processes according to example embodiments of the present disclosure. As illustrated, processing apparatus 100 includes a processing chamber 110 and a plasma chamber 120 that is separated from the processing chamber 110. Processing chamber 110 includes a workpiece support 112 or pedestal operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. The induction coil 130 can be formed of any suitable material, including conductive materials suitable for inducing plasma within the plasma chamber 120. Process gases can be provided to the chamber interior 125 from gas supply 155 and annular gas distribution channel 151 or other suitable gas introduction mechanism. When the induction coil 130 is energized with RF power from the RF power generator 134, a plasma can be generated in the plasma chamber 120. In a particular embodiment, the processing apparatus 100 can include an optional grounded Faraday shield 128 to reduce capacitive coupling of the induction coil 130 to the plasma. The grounded Faraday shield 128 can be formed of any suitable material or conductor, including materials similar or substantially similar to the induction coil 130.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

In some embodiments, the grid plate can have one or more cooling mechanisms disposed therein for cooling the grid plate during operation of the processing apparatus. For example, the one or more cooling channels can be disposed in the grid plate. Air or fluid, (e.g., water) can be pumped through the cooling channels to decrease the temperature of the grid plate. Other known cooling chemicals can be pumped through the cooling channels for cooling the grid plate.

Workpiece 114 can be or include any suitable workpiece, such as a semiconductor workpiece, such as a silicon wafer.

In some embodiments, workpiece 114 can be or include a doped silicon wafer. For example, a silicon wafer can be doped such that a resistivity of the silicon wafer is greater than about 0.1 Ω·cm, such as greater than about 1 Ω·cm.

Example embodiments of a processing apparatus will now be discussed with reference to FIGS. 1-8. As shown in FIG. 1, according to example aspects of the present disclosure, the apparatus 100 can include a gas delivery system 155 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves 158 and/or gas flow controllers 185 to deliver a desired amount of gases into the plasma chamber as process gas. The gas delivery system 155 can be used for the delivery of any suitable process gas. Example process gases include, oxygen-containing gases (e.g. $O_2$, $O_3$, $N_2O$, $H_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. In embodiments, the gas delivery system 155 can be controlled with a gas flow controller 185.

The workpiece 114 to be processed is supported in the processing chamber 110 by the workpiece support 112. The workpiece support 112 can be operable to support a workpiece 114 during thermal processing (e.g., a workpiece support plate). In some embodiments, workpiece support 112 can be configured to support a plurality of workpieces 114 for simultaneous processing. In some embodiments, workpiece support 112 can rotate workpiece 114 before, during, and/or after thermal processing. In some embodiments, workpiece support 112 can be transparent to and/or otherwise configured to allow at least some radiation to at least partially pass through workpiece support 112, including radiation from heat sources 140 to workpiece 114, radiation from emitters 150 to workpiece 114, radiation from workpiece 114 to temperature measurement devices 167 and 168, and radiation of emitter 150 reflected by workpiece 114 to reflectance sensor 166. For instance, in some embodiments, a material of workpiece support 112 can be selected to allow desired radiation to pass through workpiece support 112, such as radiation that is emitted by workpiece 114 and/or emitters 150. In some embodiments, workpiece support 112 can be or include a quartz material, such as a hydroxyl free quartz material.

Workpiece support 112 can include one or more support pins 115, such as at least three support pins, extending from workpiece support 112. In some embodiments, workpiece support 112 can be spaced from the top of the processing chamber 110, such as spaced from separation grid 220. In some embodiments, the support pins 115 and/or the workpiece support 112 can transmit heat from heat sources 140 and/or absorb heat from workpiece 114. In some embodiments, the support pins 115 can be made of quartz.

Figure 3:
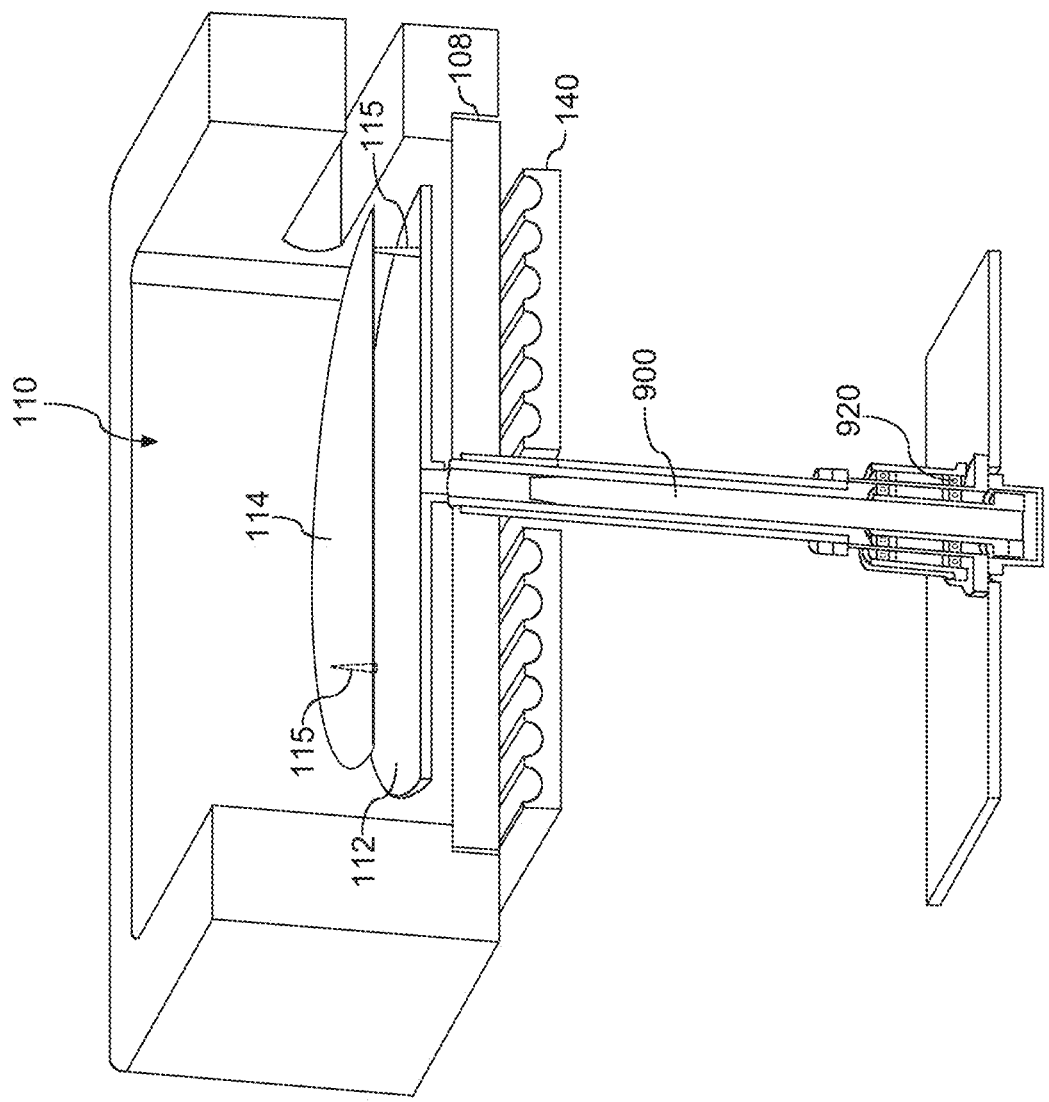
FIG. 3 depicts a portion of an example processing system according to example aspects of the present disclosure.

The processing apparatus can further include a rotation shaft 900 passing through dielectric window 108 that is configured to support the workpiece support 112 in the processing chamber 110. For example, the rotation shaft 900 is coupled on one end to the workpiece support 112 and is coupled about the other end to a rotation device 920 (as shown in FIG. 3) capable of rotating the rotation shaft 900 360°. For instance, during processing of the workpiece 114 (e.g., thermal processing) the workpiece 114 can be continually rotated such that heat generated by the one or more heat sources 140 can evenly heat the workpiece 114. In some embodiments, rotation of the workpiece 114 forms radial heating zones on the workpiece 114, which can help to provide a good temperature uniformity control during the heating cycle.

In certain embodiments, it will be appreciated that a portion of the rotation shaft 900 is disposed in the processing chamber 110 while another portion of the rotation shaft 900 is disposed outside the processing chamber 110 in a manner such that a vacuum pressure can be maintained in the processing chamber 110. For example, during processing of the workpiece 114 a vacuum pressure may need to be maintained in the processing chamber 110. Additionally, the workpiece 114 will need to be rotated during processing. Accordingly, the rotation shaft 900 is positioned through the dielectric window 108 and in the processing chamber 110, such that the rotation shaft 900 can facilitate rotation of the workpiece 114 while a vacuum pressure is maintained in the processing chamber 110.

In other embodiments, the rotation shaft 900 can be coupled to a translation device that is capable of moving the rotation shaft 900 and the workpiece support 112 up and down in a vertical manner (not shown in figures). For example, when loading or unloading workpiece 114 from the processing chamber 110, it may be desirable to raise the workpiece 114 via the workpiece support 112 so that removal devices can be used to easily access the workpiece 114 and remove it from the processing chamber 110. Example removal devices may include robotic susceptors. In other embodiments, the workpiece support 112 may need to be vertically moved in order to provide routine maintenance on the processing chamber 110 and elements associated with the processing chamber 110. Suitable translations devices that may be coupled to the rotation shaft 900 include bellows or other mechanical or electrical devices capable of translating the rotation shaft 900 in a vertical motion.

Processing apparatus 100 can include one or more heat sources 140. In some embodiments, heat sources 140 can include one or more heating lamps 141. For example, heat sources 140 including one or more heating lamps 141 can emit thermal radiation to heat workpiece 114. In some embodiments, for example, heat sources 140 can be broadband radiation sources including arc lamps, incandescent lamps, halogen lamps, any other suitable heating lamp, or combinations thereof. In some embodiments, heat sources 140 can be monochromatic radiation sources including light-emitting iodides, laser iodides, any other suitable heating lamps, or combinations thereof. The heat source 140 can include an assembly of heating lamps 141, which are positioned, for instance, to heat different zones of the workpiece 114. The energy supplied to each heating zone can be controlled while the workpiece 114 is heated. Further, the amount and/or type of radiation applied to various zones of the workpiece 114 can also be controlled in an open-loop fashion. In this configuration, the ratios between the various heating zones can be pre-determined after manual optimization. In other embodiments, the amount and/or type of radiation applied to various zones of the workpiece 114 can be controlled in a closed-loop fashion, based on temperature of the workpiece 114.

Figure 5:
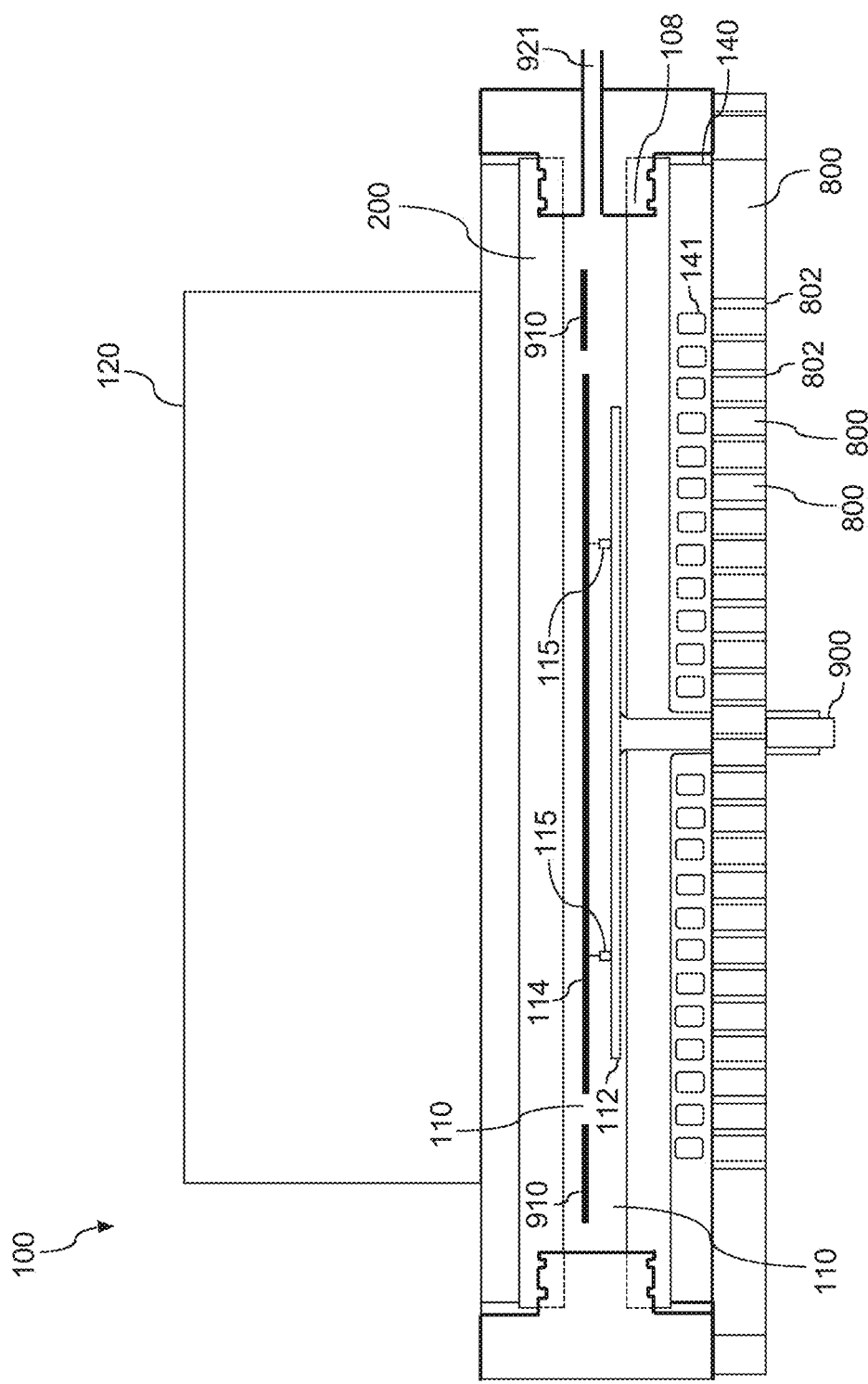
FIG. 5 depicts an example processing system according to example embodiments of the present disclosure.
Figure 6:
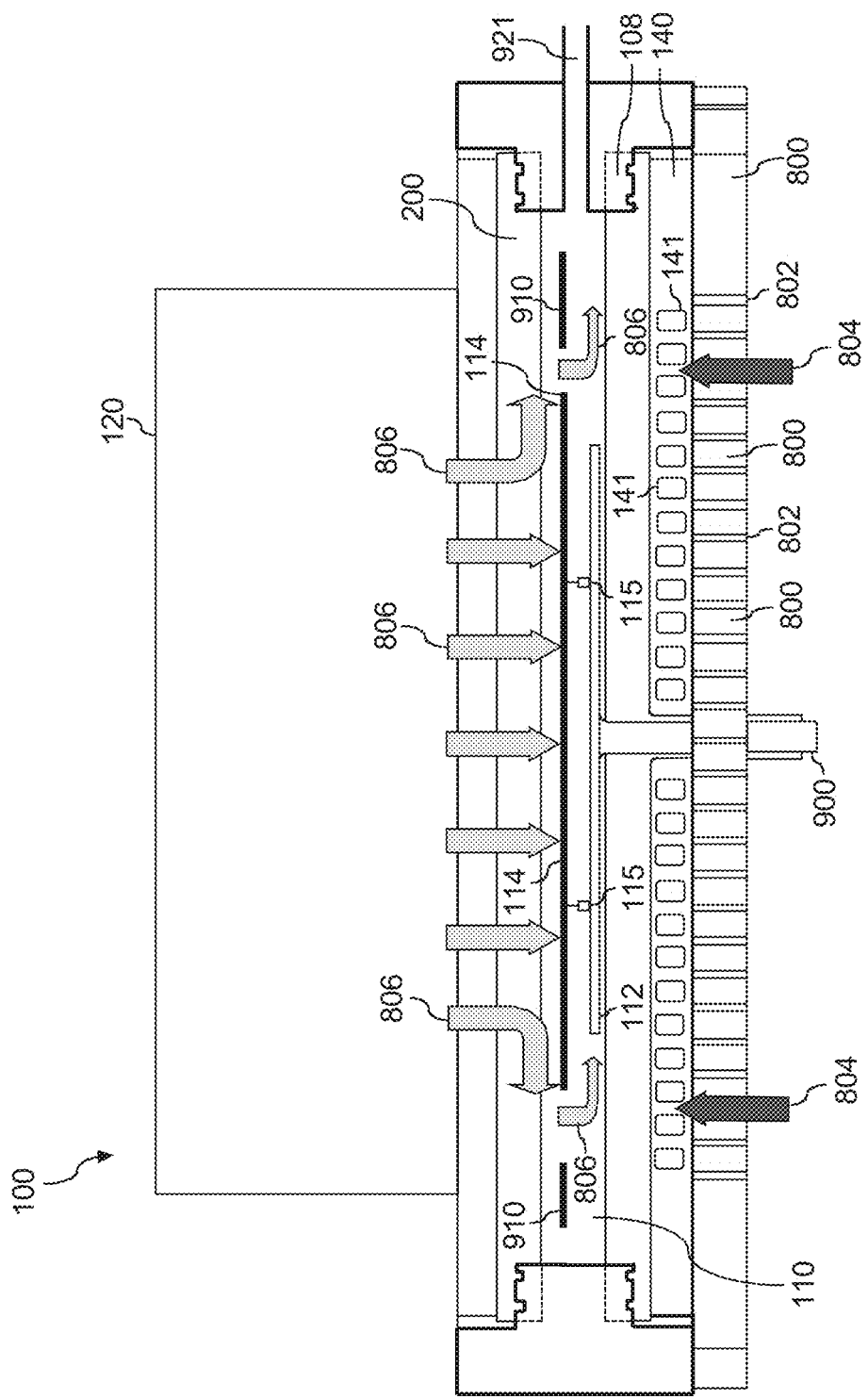
FIG. 6 depicts an example processing system according to example embodiments of the present disclosure.

In some embodiments, directive elements such as, for example, reflectors 800 (e.g., mirrors) can be configured to direct radiation from heat sources 140 into processing chamber 110. In certain embodiments, the reflectors 800 can be configured to direct radiation from one or more heating lamps 141 towards a workpiece 114 and/or workpiece support 112. For example, one or more reflectors 800 can be disposed with respect to the heat sources 140 as shown in FIGS. 5 and 6. One or more cooling channels 802 can be disposed between or within the reflectors 800. As shown by arrows 804 in FIG. 6, ambient air can pass through the one or more cooling channels 802 to cool the one or more heat sources 140, such as the heat lamps 141.

According to example aspects of the present disclosure, one or more dielectric windows 108 can be disposed between the heat sources 140 and the workpiece support 112. According to example aspects of the present disclosure, window 108 can be disposed between workpiece 114 and heat sources 140. Window 108 can be configured to selectively block at least a portion of radiation (e.g., broadband radiation) emitted by heat sources 140 from entering a portion of the processing chamber 110. For example, window 108 can include opaque regions 160 and/or transparent regions 161. As used herein, "opaque" means generally having a transmittance of less than about 0.4 (40%) for a given wavelength, and "transparent" means generally having a transmittance of greater than about 0.4 (40%) for a given wavelength.

Opaque regions 160 and/or transparent regions 161 can be positioned such that the opaque regions 160 block stray radiation at some wavelengths from the heat sources 140, and the transparent regions 161 allow, for example, emitters 150, reflectance sensor 166, and/or temperature measurement devices 167, 168 to have no obstruction to workpiece 114 in processing chamber 110 at the wavelengths blocked by opaque regions 160. In this way, the window 108 can effectively shield the processing chamber 110 from contamination by heat sources 140 at given wavelengths while still allowing the heat sources 140 to heat workpiece 114. Opaque regions 160 and transparent regions 161 can generally be defined as opaque and transparent, respectively, to a particular wavelength; that is, for at least radiation at the particular wavelength, the opaque regions 160 are opaque and the transparent regions 161 are transparent.

Window 108, including opaque regions 160 and/or transparent regions 161, can be formed of any suitable material and/or construction. In some embodiments, dielectric window 108 can be or include a quartz material. Furthermore, in some embodiments, opaque regions 160 can be or include hydroxyl (OH) containing quartz, such as hydroxyl (OH—) doped quartz, and transparent regions 161 can be or include hydroxyl free quartz. Hydroxyl doped quartz can exhibit desirable wavelength blocking properties in accordance with the present disclosure. For instance, hydroxyl doped quartz can block radiation having a wavelength of about 2.7 micrometers, which can correspond to a temperature measurement wavelength at which some sensors (e.g., reflectance sensor 166 and temperature measurement devices 167, 168) in the processing apparatus 100 operate, while hydroxyl free quartz can be transparent to radiation with a wavelength of about 2.7 micrometers. Thus, the hydroxyl doped quartz regions can shield the sensors (e.g., reflectance sensor 166 and temperature measurement devices 167, 168) from stray radiation of the wavelength in the processing chamber 110 (e.g., from heat sources 140), and the hydroxyl free quartz regions can be disposed at least partially within a field of view of the sensors to allow the sensors to obtain measurements at the wavelength within the thermal processing system.

Accordingly, in embodiments, the dielectric window 108 includes one or more transparent regions 161 that are transparent to at least a portion of radiation within the temperature measurement wavelength range and one or more opaque regions 160 that are opaque to the portion of radiation within the temperature measurement wavelength range. The one or more opaque regions 160 are configured to block at least a portion of the broadband radiation emitted by the heat sources 140 within the temperature measurement wavelength range.

Figure 4:
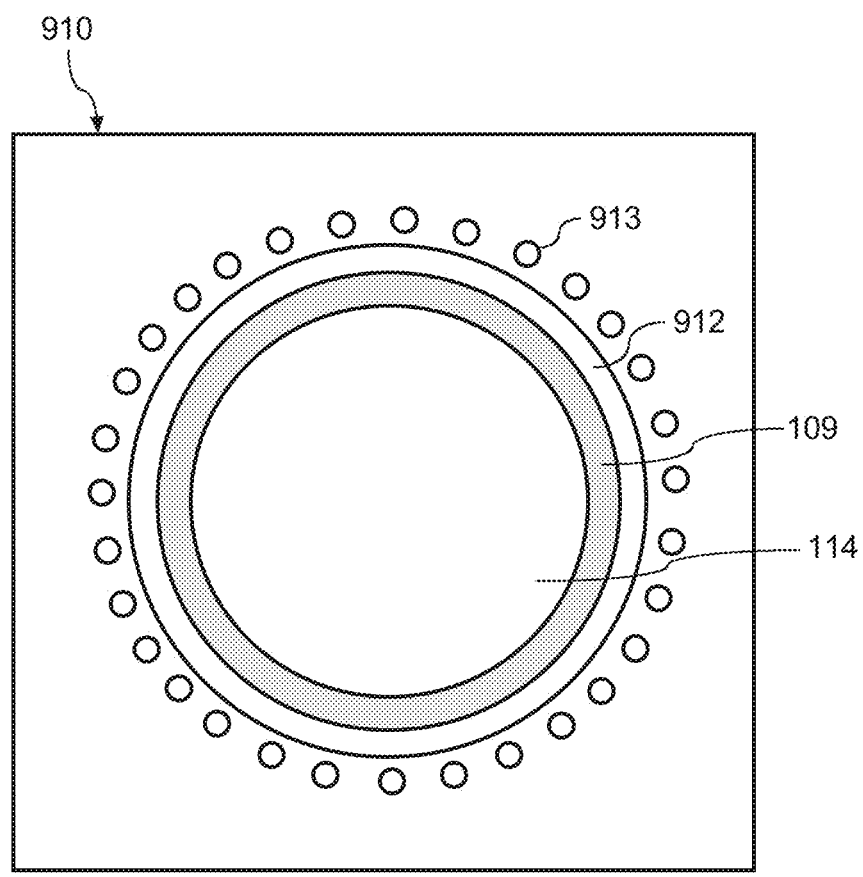
FIG. 4 depicts an example pumping plate according to example aspects of the present disclosure.

A guard ring 109 can be used to lessen edge effects of radiation from one or more edges of the workpiece 114. The guard ring 109 can be position around the perimeter of the workpiece 114. Further, in embodiments, the processing apparatus includes a pumping plate 910 disposed around the workpiece 114. For example, FIG. 4 illustrates an example pumping plate 910 that can be used in embodiments provided. The pumping plate 910 includes one or more pumping channels 912, 913 for facilitating the flow of gas through the processing chamber 110. For example, the pumping plate 910 can include a continuous pumping channel 912 configured around the workpiece 114. The continuous pumping channel 912 can include an annular opening configured to allow gas to pass from a first side, such as a top side, of the workpiece 114 to a second side, such as the back side, of the workpiece. The continuous pumping channel 912 can be disposed concentrically around the guard ring 109. Additional pumping channels 913 can be disposed in the pumping plate 910 to facilitate gas movement within the processing chamber 110. The pumping plate 910 can be or include a quartz material. Furthermore, in some embodiments, pumping plate 910 can be or include hydroxyl (OH) containing quartz, such as hydroxyl doped quartz (e.g., quartz that contains a significant level of hydroxyl groups). Hydroxyl doped quartz can exhibit desirable wavelength blocking properties in accordance with the present disclosure.

One or more exhaust ports 921 can be disposed in the processing chamber 110 that are configured to pump gas out of the processing chamber 110, such that a vacuum pressure can be maintained in the processing chamber 110. For example, process gas can flow from the plasma chamber 120 through the one or more separation grids 200 and enter the processing chamber 110 according to the arrows as depicted in FIG. 6. The process gas is exposed to the workpiece 114 and then flows around either side of the workpiece 114 and is evacuated from the processing chamber 110 via one or more exhaust ports 921. The flow of the process gas is shown by arrows 806 in FIG. 6. One or more pumping plates 910 can be disposed around the outer perimeter of the workpiece 114 to facilitate process gas flow. Isolation door 180, when open, allows entry of the workpiece 114 to the processing chamber 110 and, when closed, allows the processing chamber 110 to be sealed, such that a vacuum pressure can be maintained in the processing chamber 110 such that thermal processing can be performed on workpiece 114.

In embodiments, the apparatus 100 can include a controller 175. The controller 175 controls various components in processing chamber 110 to direct processing of workpiece 114. For example, controller 175 can be used to control heat sources 140. Additionally and/or alternatively, controller 175 can be used to control a workpiece temperature measurement system, including, for instance, emitter 150, reflectance sensor 166, and/or temperature measurement devices 167, 168. The controller 175 can also implement one or more process parameters, such as controlling the gas flow controllers 185 and altering conditions of the processing chamber 110 in order to maintain a vacuum pressure in the processing chamber during processing of the workpiece 114. The controller 175 can include, for instance, one or more processors and one or more memory devices. The one or more memory devices can store computer-readable instructions that, when executed by the one or more processors, cause the one or more processors to perform operations, such as any of the control operations described herein.

Figure 2:
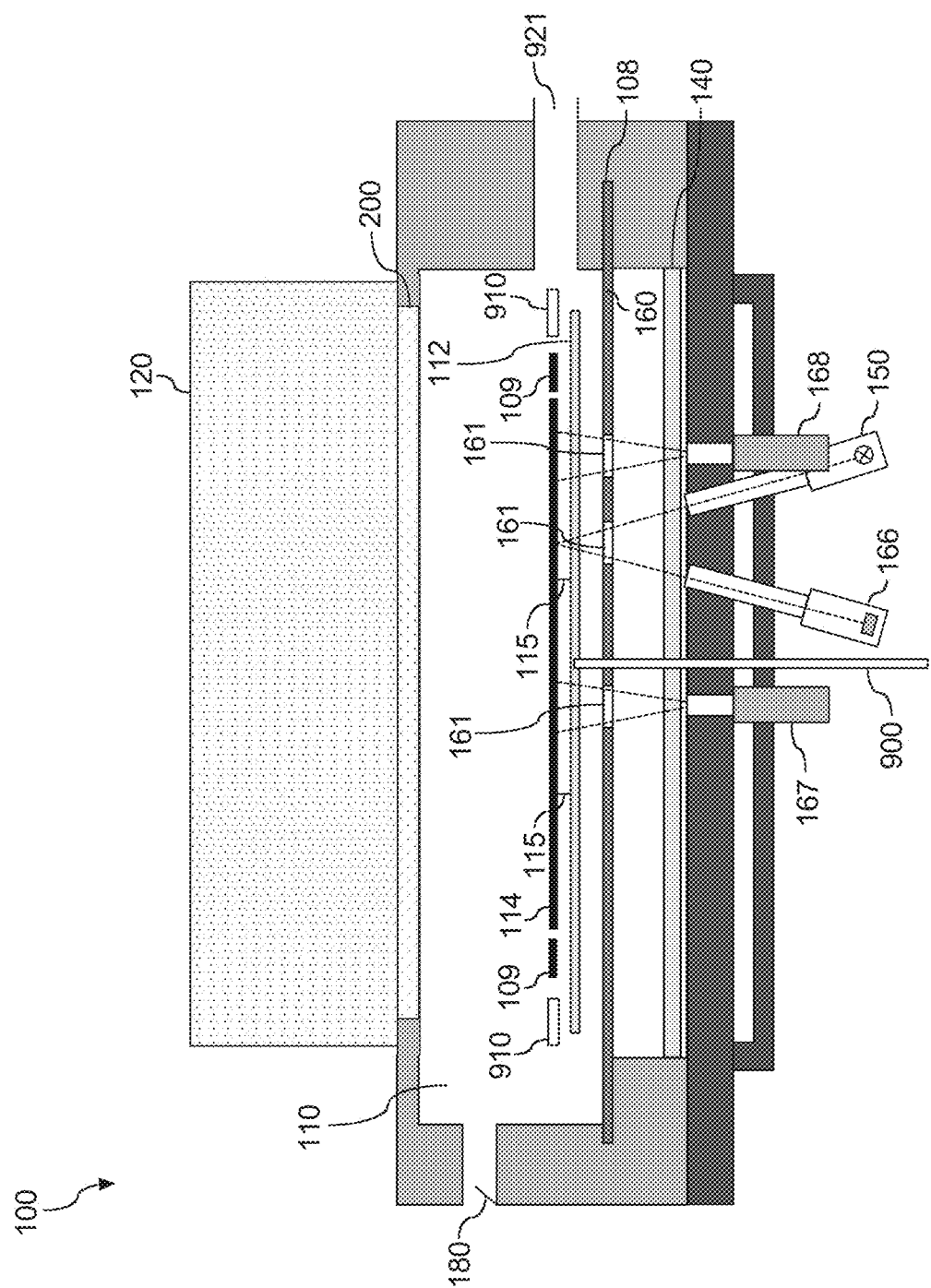
FIG. 2 depicts an example processing system according to example aspects of the present disclosure.

In particular, FIGS. 1-2 depict certain components useful in the workpiece temperature measurement system, including one or more temperature measurement devices 167,168. In embodiments, temperature measurement device 167 is located in a more centered location with respect to temperature measurement device 168. For example, temperature measurement device 167 can be disposed on or next to a centerline of the workpiece support 112, such that when a workpiece 114 is disposed on the workpiece support 112, temperature measurement device 167 can obtain a temperature measurement corresponding to the center of the workpiece 114. Temperature measurement device 168 can be disposed in an outer location from the centerline of the workpiece support 112, such that temperature measurement device 168 can measure the temperature of the workpiece 114 along an outer perimeter of the workpiece 114. Accordingly, the temperature measurement system includes one or more temperature measurement devices capable of measuring the temperature of the workpiece 114 at different locations on the workpiece 114. Temperature measurement devices 167,168 can include one or more sensors capable of sensing radiation emitted from the workpiece 114, such as pyrometers. Temperature measurement devices 167,168 can also include one or more sensors capable of sensing a reflected portion of radiation that is emitted by an emitter and reflected by the workpiece, which will be discussed in more detail hereinbelow.

For instance, in some embodiments, temperature measurement devices 167, 168 can be configured to measure radiation emitted by workpiece 114 at a temperature measurement wavelength range. For example, in some embodiments, temperature measurement devices 167, 168 can be a pyrometer configured to measure radiation emitted by the workpiece at a wavelength within the temperature measurement wavelength range. The wavelength can be selected in such that that transparent regions 161 are transparent to and/or opaque regions 160 are opaque to, for example at 2.7 micrometers, in embodiments where the opaque regions 160 include hydroxyl doped quartz. The first wavelength can additionally correspond to a wavelength of blackbody radiation emitted by workpiece 114. The temperature measurement wavelength range can include 2.7 micrometers accordingly.

In some embodiments, the temperature measurement system includes one or more emitters 150 and one or more reflectance sensors 166. For example, in embodiments the workpiece temperature measurement system can also include an emitter 150 configured to emit radiation directed at an oblique angle to workpiece 114. In embodiments, emitter 150 can be configured to emit infrared radiation. The radiation emitted by emitter 150 may also be referred to herein as calibration radiation. Radiation emitted by emitter 150 can be reflected by workpiece 114 forming a reflected portion of radiation that is collected by reflectance sensor 166. The reflectance of workpiece 114 can be represented by the intensity of the reflected portion of radiation incident on reflectance sensor 166. For an opaque workpiece 114, the emissivity of workpiece 114 can then be calculated from reflectance of workpiece 114. At the same time, radiation emitted by the workpiece 114 can be measured by sensors in temperature measurement devices 167 and 168. In some embodiments, such radiation emitted by workpiece 114 and measured by sensors in temperature measurement devices 167 and 168 does not constitute the reflected portion of the calibration radiation that was emitted by emitter 150 and reflected by workpiece 114. Finally, the temperature of the workpiece 114 can be calculated based on radiation emitted by workpiece 114 in combination with the emissivity of workpiece 114.

Radiation emitted by an emitter (e.g., emitter 150) and/or measured by a sensor (e.g., reflectance sensor 166 and/or sensors in temperature measurement devices 167,168) can have one or more associated wavelengths. For instance, in some embodiments, an emitter can be or include a narrow-band emitter that emits radiation such that a wavelength range of the emitted radiation is within a tolerance of a numerical value, such as within 10% of the numerical value, in which case the emitter is referred to by the numerical value. In some embodiments, this can be accomplished by a combination of a broadband emitter that emits a broadband spectrum (e.g., a Planck spectrum) and an optical filter, such as an optical notch filter, configured to pass only a narrow band within the broadband spectrum. Similarly, a sensor can be configured to measure an intensity of narrow-band radiation at (e.g., within a tolerance of) a wavelength of a numerical value. For example, in some embodiments, a sensor, such as a pyrometer, can include one or more heads configured to measure (e.g., select for measurement) a particular narrow-band wavelength.

According to example aspects of the present disclosure, one or more transparent regions 161 can be disposed at least partially in a field of view of emitter 150 and/or reflectance sensor 166. For instance, emitter 150 and reflectance sensor 166 can operate at the temperature measurement wavelength range at which the transparent regions 161 are transparent. For example, in some embodiments, emitter 150 and/or reflectance sensor 166 can operate at 2.7 micrometers. As illustrated in FIGS. 1 and 2, the transparent regions 161 can be positioned such that a radiation flow (indicated generally by dashed lines) starts from emitter 150, passes through transparent regions 161, is reflected by the workpiece 114, and is collected by reflectance sensor 166, without obstruction by window 108 (e.g., opaque regions 160). Similarly, opaque regions 160 can be disposed in regions on window 108 that are outside of the emitted and reflected radiation flow to shield workpiece 114 and especially reflectance sensor 166 from radiation in the temperature measurement wavelength range from heat sources 140. For example, in some embodiments, transparent regions 161 can be included for sensors and/or emitters operating at 2.7 micrometer wavelengths.

In some embodiments, emitter 150 and/or reflectance sensor 166 can be phase-locked. For instance, in some embodiments, emitter 150 and/or reflectance sensor 166 can be operated according to a phase-locked regime. For instance, although opaque regions 160 can be configured to block most stray radiation from heat sources 140 at a first wavelength, in some cases stray radiation can nonetheless be perceived by reflectance sensor 166, as discussed above. Operating the emitter 150 and/or reflectance sensor 166 according to a phase-locked regime can contribute to improved accuracy in intensity measurements despite the presence of stray radiation.

Figure 7:
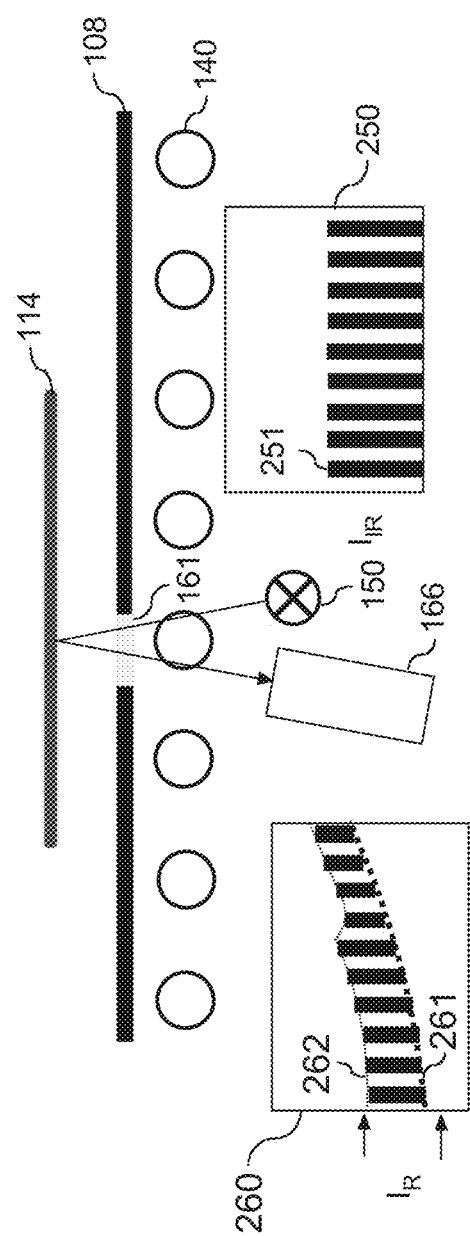
FIG. 7 depicts an example temperature measurement system according to example embodiments of the present disclosure.

As shown in FIG. 7, an example phase locking regime is discussed with respect to plots 250, 260. Plot 250 depicts radiation intensity for radiation $I_{IR}$ emitted within the temperature measurement wavelength range by emitter 150 over time (e.g., over a duration of treatment processes performed on workpiece 114). As illustrated in plot 250, radiation intensity emitted by emitter 150 can be modulated. For example, the emitter 150 can emit the calibration radiation onto the workpiece 114 with a modulation in intensity. For instance, the radiation intensity emitted by emitter 150 can be modulated as pulses 251. In some embodiments, radiation can be emitted by emitter 150 in a pulsing mode. In some other embodiments, a constant radiation of emitter 150 can be blocked periodically by a rotating chopper wheel (not shown in the figure). A chopper wheel can include one or more blocking portions and/or one or more passing portions. A chopper wheel can be revolved in a field of view of emitter 150 such that a constant stream of radiation from emitter 150 is intermittently interrupted by blocking portions and passed by passing portions of the chopper wheel. Thus, a constant stream of radiation emitted by emitter 150 can be modulated into pulses 251 with a pulsing frequency corresponding to the chopper wheel rotation. The pulsing frequency can be selected to be or include a frequency having little to no overlap to operation of other components in the processing apparatus 100. For example, in some embodiments, the pulsing frequency can be about 130 Hz. In some embodiments, a pulsing frequency of 130 Hz can be particularly advantageous as heat sources 140 can be configured to emit substantially no radiation having a frequency of 130 Hz. Additionally and/or alternatively, reflectance sensor 166 can be phase-locked based on the pulsing frequency. For instance, the processing apparatus 100 (e.g., controller 175) can isolate a measurement (e.g., a reflectivity measurement of workpiece 114) from reflectance sensor 166 based on calibration radiation of emitter 150 modulated at the pulsing frequency and reflected from the workpiece 114. In this way, processing apparatus 100 can reduce interference from stray radiation in measurements from reflectance sensor 166. In embodiments, at least one reflectance measurement can be isolated from one or more sensors based, at least in part, on the pulsing frequency.

Similarly, plot 260 depicts reflected radiation intensity IR measured by reflectance sensor 166 over time. Plot 260 illustrates that, over time (e.g., as workpiece 114 increases in temperature), stray radiation in the chamber (illustrated by stray radiation curves 261) can increase. This can be attributable to, for example, an increasing emissivity of workpiece 114 and correspondingly a decreasing reflectivity of workpiece 114 with respect to an increased temperature of workpiece 114, an increased intensity of heat source 140, and/or various other factors related to processing of workpiece 114.

During a point in time at which emitter 150 is not emitting radiation, reflectance sensor 166 can obtain measurements corresponding to the stray radiation curves 261 (e.g., stray radiation measurements). Similarly, during a point in time at which emitter 150 is emitting radiation (e.g., pulse 251), reflectance sensor 166 can obtain measurements corresponding to total radiation curves 262 (e.g., total radiation measurements). The reflectance measurements can then be corrected based on this information indicative of stray radiation curves 261.

While example embodiments disclose that reflectance sensor 166 is used to collect reflected radiation that is emitted by emitter 150, the disclosure is not so limited. In certain embodiments, one or more heating lamps 141 may be used to emit radiation similar to that of emitter 150 as described herein. For example, radiation emitted by the one or more heating lamps 141 can include a first radiation component and a second radiation component. The first radiation component emitted is configured to heat workpiece 114, while the second radiation component emitted is modulated at the pulsing frequency. Portions of the modulated second radiation component emitted by the one or more heat lamps 141 can be reflected by the workpiece 114 and collected by the reflectance sensor 166, such that a reflectivity measurement of workpiece 114 can be obtained.

In other certain embodiments, temperature measurement devices 167, 168 can also be configured with sensors capable of functioning in a similar manner to reflectance sensor 166. Namely, temperature measurement devices 167, 168 can also collect reflected portions of a modulated radiation, such as calibration radiation, that can be used to determine a reflectivity measurement of workpiece 114. In some embodiments, the processing apparatus (e.g., controller 175) can isolate from reflectance sensor 166 and/or temperature measurement devices 167, 168, a first radiation measurement of workpiece 114 and a second reflectivity measurement of workpiece 114. The second reflectivity measurement of workpiece 114 is based on a reflected portion of radiation emitted by emitter 150 or one or more heat lamps 141 modulated at the pulsing frequency.

In certain embodiments, a workpiece temperature control system can be used to control power supply to the heat sources 140 in order to adjust the temperature of the workpiece 114. For example, in certain embodiments the workpiece temperature control system can be part of the controller 175. In embodiments, the workpiece temperature control system can be configured to change the power supply to the heat source 140 independent to the temperature measurement obtained by the temperature measurement system. However, in other embodiments, the workpiece temperature control system can be configured to change the power supply to the heat sources 140 based, at least in part, on the one or more temperature measurements of workpiece 114. A closed loop feedback control can be applied to adjust the power supply to the heat sources 140 such that energy from the heat sources 140 applied to the workpiece 114 will heat the workpiece to but not above a desired temperature. Thus, the temperature of the workpiece 114 may be maintained by closed loop feedback control of the heat source 140, such as by controlling the power to the heat source 140.

As described, the heat sources 140 are capable of emitting radiation at a heating wavelength range and the temperature measurement system is capable of obtaining a temperature measurement about a temperature measurement wavelength range. Accordingly, in certain embodiments the heating wavelength range is different from the temperature measurement wavelength range.

Figure 8:
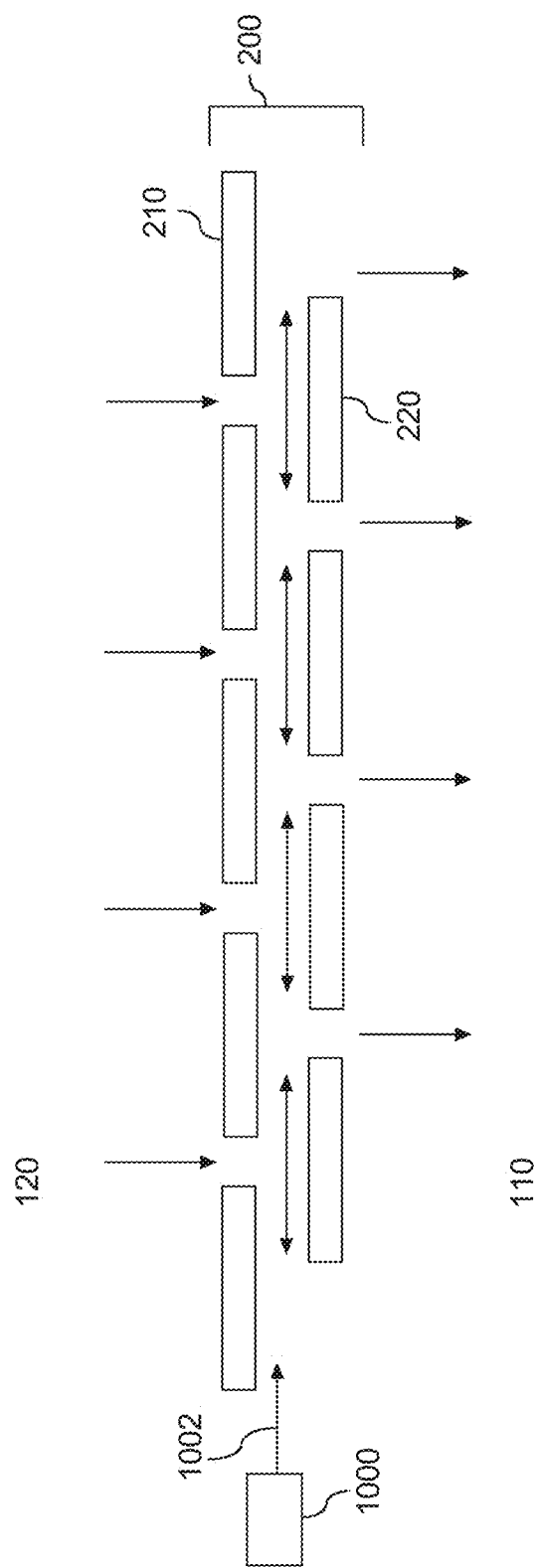
FIG. 8 depicts an example post plasma gas injection system according to example embodiments of the present disclosure.

FIG. 8 illustrates an example post plasma gas injection at a separation grid according to example embodiments of the disclosure. FIG. 8 will be discussed with reference to the processing apparatus 100 of FIG. 1 by way of example.

According to example aspects of the present disclosure, the processing apparatus 100 can include one or more gas ports 1000 configured to inject a gas into the neutral species flowing through the separation grid 200. For instance, a gas port 1000 can be operable to inject a gas (e.g., a cooling gas) between grid plates in a multi-plate separation grid. In this way, the separation grid can provide post plasma gas injection into the neutral species. The post plasma gas injection can provide a number of technical effects and benefits. In some embodiments, the gas can be injected to control uniformity characteristics of a process. For example, a neutral gas (e.g., inert gas) can be injected to control uniformity, such as uniformity in a radial direction with respect to the workpiece. In some other embodiments, cooling gas can be injected to control the energy of radicals passing through the separation grid.

The separation grid 200 can be a multi-plate separation grid (e.g., a dual-plate grid shown in FIG. 1, a three-plate grid, a four-plate grid, etc.). As shown in FIG. 8, the processing apparatus 100 can include a gas port 1000 configured to inject a gas 1002 between grid plate 210 and grid plate 220, such as in the channel formed between grid plate 210 and grid plate 220. More particularly, the mixture of ions and neutral species generated in the plasma can be exposed to grid plate 210. The gas port 1000 can inject a gas 1002 or other substance into neutral species flowing through the grid plate 210. Neutral species passing through grid plate 220 can be exposed to a workpiece. In some embodiments, the gas port 1000 can inject a gas 1002 directly into the processing chamber 110 at a location below the separation grid 200 and above the surface of the workpiece 114.

The gas 1002 or other substance from the gas port 1000 can be at a higher or lower temperature than the radicals coming from the plasma chamber 120 or can be the same temperature as the radicals from the plasma chamber 120. The gas can be used to adjust or correct uniformity, such as radical uniformity, within the processing apparatus 100, by controlling the energy of the radicals passing through the separation grid 200. The non-process gas may include a dilution gas, such as nitrogen ($N_2$) and/or an inert gas, such as helium (He), argon (Ar) or other inert gas. In some embodiments, the gas 1002 can be an inert gas, such as helium, nitrogen, and/or argon.

Figure 9:
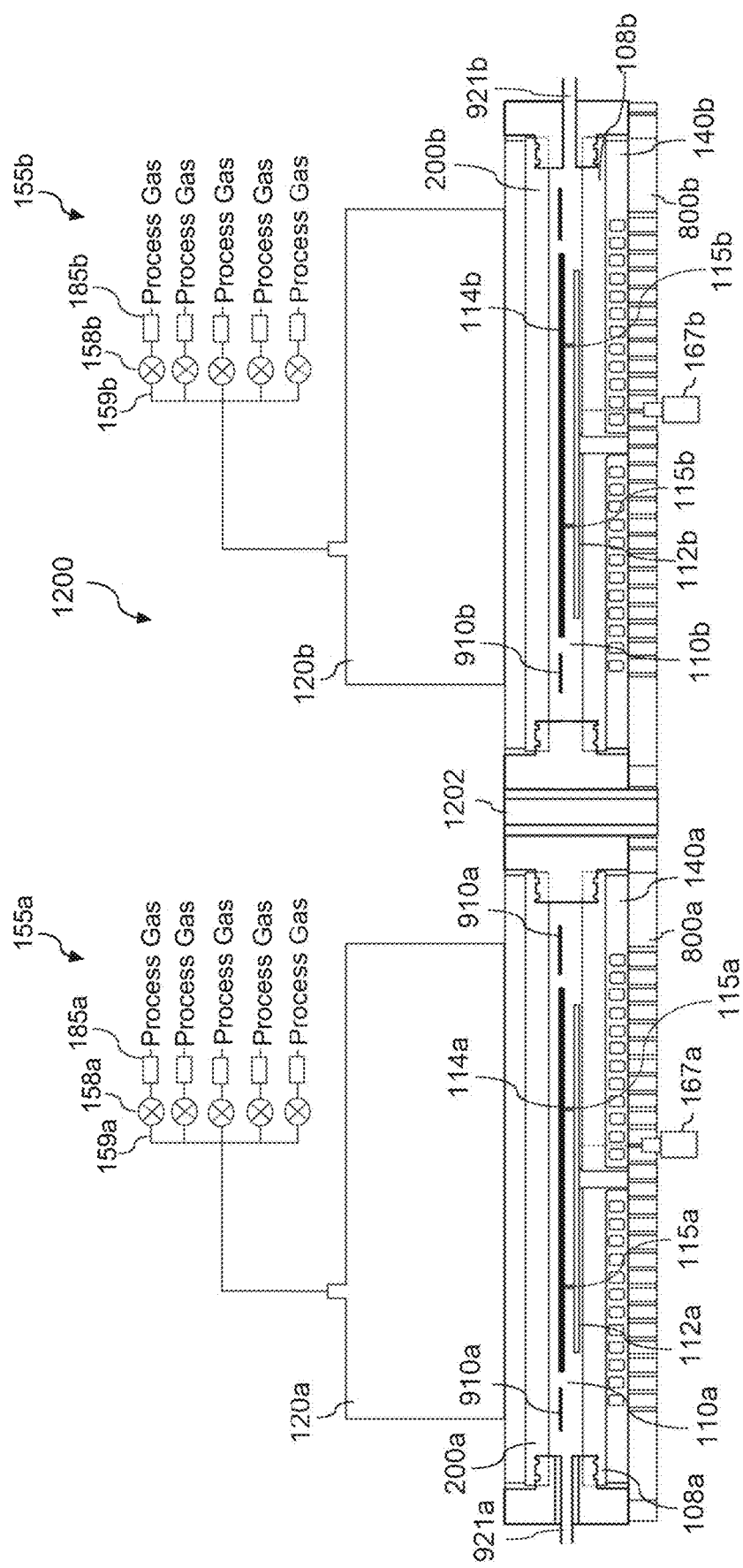
FIG. 9 depicts an example processing system according to example aspects of the present disclosure.

In embodiments, the processing apparatus can have a dual workpiece configuration as shown in FIG. 9. For example, the processing apparatus 1200 includes plasma chambers 120a,120b and processing chambers 110a,110b. In embodiments, the processing chambers 110a,110b can be divided by a wall 1202. In other embodiments, however, it is contemplated that the processing chamber 110 includes an undivided processing chamber (not shown in the figure). As shown, a workpiece supports 112a,112b are disposed in the processing chambers 110a,110b for supporting workpieces 114a,114b. One or more heat sources 140a,140b are disposed on an opposite side of the processing chambers 110a,110b from the plasma chambers 120a,120b. One or more separation grids 200a,200b separate the processing chambers 110a,110b from the plasma chambers 120a,120b. One or more dielectric windows 108a,108b are disposed between the heat sources 140a,140b and the workpiece supports 112a,112b. One or more temperature measurement devices 167a,167b configured to obtain a temperature measurement of the workpieces 114a,114b can also be disposed relative to processing chambers 110a,110b. While only temperature measurement devices 167a,167b are shown, the dual workpiece processing apparatus 1200 can include other components of the temperature measurement system as described herein, including emitters 150, reflectance sensors 166, temperature measurement devices 168, etc. (not shown in FIG. 9).

Rotation shafts 900a,900b are coupled to the workpiece supports 112a,112b for rotating the workpiece supports 112a,112b in processing chambers 110a,110b. Portions of the rotation shafts 900a,900b may be disposed in the processing chambers 110a,110b, while other portions of the rotations shafts 900a,900b are disposed outside of the processing chambers 110a,110b, such that a vacuum pressure can be maintained in the processing chambers 110a,110b while the rotation shafts 900a,900b facilitate rotation of workpieces 114a,114b.

The apparatus 1200 can include gas delivery systems 155a,155b configured to deliver process gas to the processing chambers 110a,110b, for instance, via gas distribution channels 151a,151b or other distribution system (e.g., showerhead). The gas delivery systems 155a,155b can include a plurality of feed gas lines 159a,159b. The feed gas lines 159a,159b can be controlled using valves 158a,158b and/or gas flow controllers 185a,185b to deliver a desired amount of gases into the plasma chamber as process gas. The gas delivery systems 155a,155b can be used for the delivery of any suitable process gas. Control valves 158a,158b can be used to control a flow rate of each feed gas line to flow a process gas into the processing chambers 110a,110b. In some embodiments, the gas delivery systems 155a,155b can be controlled with gas flow controllers 185a,185b. In some other embodiments, the gas distribution system 155 can be a unitary system including feed gas lines 159 coupled to a single gas distribution line capable of delivering process gas into plasma chambers 110a,110b via gas distribution channels 151 (not shown in the figures).

Such dual workpiece configurations allow for the processing of multiple workpieces. For example, a workpiece can be transferred and processed in processing chamber 110a while another workpiece is simultaneously processed in processing chamber 110b. For example, the workpiece in the first processing chamber 110a can be processed via a suitable plasma and/or thermal treatment while another workpiece in the second processing chamber 110b can be processed via a suitable plasma and/or thermal treatment.

Figure 10:
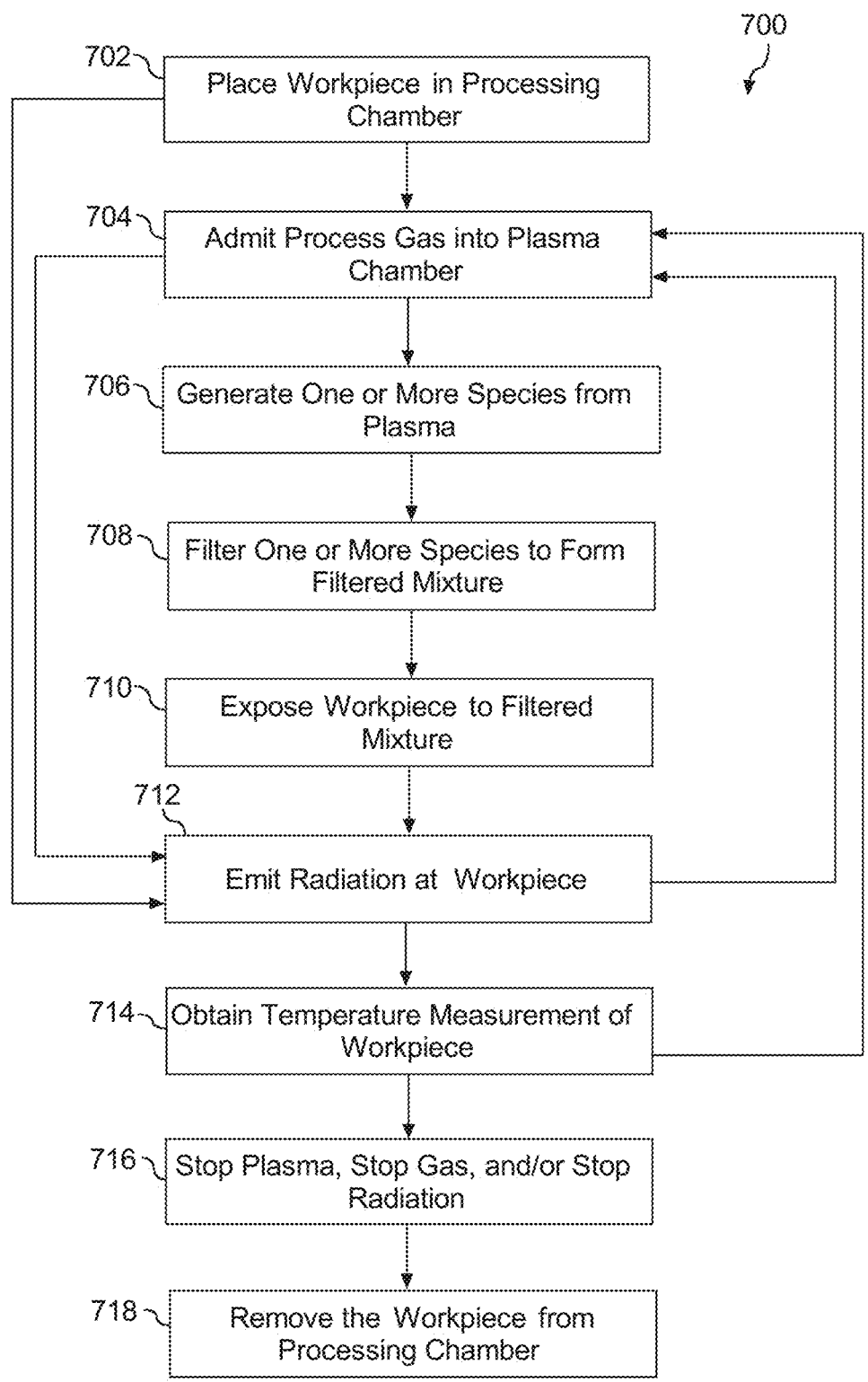
FIG. 10 depicts an example flowchart of a method according to example aspects of the present disclosure.

FIG. 10 depicts a flow diagram of one example method (700) according to example aspects of the present disclosure. The method (700) will be discussed with reference to the processing apparatus 100 of FIG. 1 by way of example. The method (700) can be implemented in any suitable processing apparatus. FIG. 10 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (702), the method can include placing a workpiece 114 in a processing chamber 110 of a processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece 114 can include one or more layers comprising silicon, silicon dioxide, silicon carbide, one or more metals, one or more dielectric materials, or combinations thereof.

At (704) the method includes admitting a process gas to the plasma chamber. For example, a process gas can be admitted to the plasma chamber 120 via the gas delivery system 155 including a gas distribution channel 151. The gas delivery system 155 can be used to deliver a process gas capable of etching at least one material layer from the workpiece 114. For example, the process gas can include oxygen-containing gases (e.g. $O_2$, $O_3$, $N_2O$, $H_2O$), hydrogen-containing gases (e.g., $H_2$, $D_2$), nitrogen-containing gases (e.g. $N_2$, $NH_3$, $N_2O$), fluorine-containing gases (e.g.

$CF_4$, $C_2F_4$, $CHF_3$, $CH_2F_2$, $CH_3F$, $SF_6$, $NF_3$), hydrocarbon-containing gases (e.g. $CH_4$), or combinations thereof. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. A gas flow controller 185 can be used to control the flow of process gas.

At (706) the method includes generating one or more species from the process gas using a plasma induced in the plasma chamber 120. For example, to generate one or more species or radicals, the induction coil 130 can be energized with RF power from the RF power generator 134, to generate a plasma from the process gas in the plasma chamber 120. The plasma generated can include one or more species including radicals. Suitable radicals can include etchant radicals capable of removing portions of material or material layer from a workpiece. Other radicals can be generated that can modify surface properties of the workpiece 114. For example, radicals can be generated that can selectively deposit material layers on portions of the workpiece. Radicals can be generated that are capable of modifying the chemical or material composition of material layers on the workpiece, including but not limited to surface cleaning, surface smoothing, materials oxidation, materials nitridation, materials doping, etc. Examples of suitable radicals include, hydrogen radicals, oxygen radicals, fluorine radicals, and combinations thereof. In some embodiments, the plasma generated in the plasma chamber is a remote plasma containing one or more radicals, such as hydrogen radicals, fluorine radicals, oxygen radicals, and combinations thereof.

At (708) the method includes filtering the one or more species to generate a filtered mixture. To create a filtered mixture the one or more species can be filtered via a separation grid 200 that separates the plasma chamber 120 from the processing chamber 110 to generate the desired radicals. The separation grid 200 can be used to perform ion filtering from a mixture generated by plasma in the plasma chamber 120 to generate a filtered mixture. The filtered mixture may contain one or more radicals.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

In some embodiments, one or more separation grid plates can include one or more cooling channels disposed therein. The method can include cooling the one or more separation grids by pumping water through one or more cooling channels.

Further, in some embodiments the method includes admitting a non-process gas through one or more gas injection ports at or below the separation grid to adjust energy of radicals passing through the separation grid.

At (710) the method includes exposing the workpiece to the filtered mixture. The filtered mixture can include one or more radicals capable of modifying a surface of the workpiece 114. For example, the filtered mixture can include one or more radicals capable of stripping material from the workpiece 114. In other embodiments, the filtered mixture can include one or more radicals capable of depositing material layers on the workpiece 114. In other embodiments, the filtered mixture can include one or more radicals capable of modifying the chemical composition or chemical or mechanical properties of one or more material layers on the surface of the workpiece 114.

At (712) the method includes emitting radiation directed at one or more surfaces of the workpiece to heat the workpiece. For example, one or more heat sources 140 can include one or more heating lamps 141. Other suitable heat sources can be used as previously described herein. In some embodiments, directive elements such as, for example, reflectors 800 (e.g., mirrors) can be configured to direct radiation from heat sources 140 into processing chamber 110 towards workpiece 114 and/or workpiece support 112.

In certain embodiments, the workpiece 114 can be rotated in the processing chamber 110 during heating of the workpiece. For example, the rotation shaft 900 coupled to the workpiece support 112, can be used to rotate the workpiece 114 in the processing chamber 110.

Exposing the workpiece 114 to the filtered mixture (710) and emitting radiation at the workpiece (712) can be alternated until desired processing of the workpiece is achieved. In other embodiments, it may be desirable to expose the workpiece 114 to the filtered mixture while simultaneously emitting radiation at the workpiece to heat the workpiece. Depending on process parameters, process gas can be removed from the processing chamber 110 via one or more gas exhaust ports 921.

At (714) the method includes obtaining a temperature measurement indicative of a temperature of the workpiece 114. For example, one or more temperature measurement devices 167,168, emitters 150, and/or reflectance sensors 166 can be used to obtain a temperature measurement indicative of a temperature of the workpiece 114, as previously described herein. In some embodiments, temperature measurement can comprise: emitting, by one or more emitters, calibration radiation at one or more surfaces of the workpiece; measuring, by one or more reflectance sensors, a reflected portion of the calibration radiation emitted by the one or more emitters and reflected by the one or more surfaces of the workpiece; and determining, based at least in part on the reflected portion, a reflectivity of the workpiece 114. In some embodiments, the workpiece reflectivity measurement can be obtained by modulating radiation emitted by the one or more emitters at a pulsing frequency; and isolating at least one measurement from the one or more reflectance sensors based at least in part on the pulsing frequency. The emissivity of the workpiece 114 can be determined from reflectivity of the workpiece 114. In some other embodiments, one or more sensors, such as those in the temperature measurement devices 167,168, can be used to obtain a direct irradiation measurement from the workpiece 114. One or more windows 106,108 can be used to block at least a portion of broadband radiation emitted by the one or more heating lamps 141 from being incident on the one or more sensors, such as those in the temperature measurement devices 167,168 or the reflectance sensor 166. The temperature of the workpiece 141 can be determined from radiation and emissivity of the workpiece 114.

In embodiments, as indicated by the various arrows in FIG. 10 the method can include the listed steps in a variety of orders or combinations. For example, in certain embodiments, the workpiece 114 may be placed in the processing chamber 110 and exposed to radiation from the heat sources 140 before plasma treatment of the workpiece 114. In other embodiments, after obtaining a temperature measurement of the workpiece 114, the workpiece 114 can be subjected to a plasma treatment or thermal treatment process. Exposing the workpiece 114 to the filtered mixture, emitting radiation at the workpiece 114, and obtaining a temperature measurement of the workpiece 114 can be alternated until desired processing of the workpiece 114 is achieved. In other embodiments, it may be desirable to expose the workpiece 114 to the filtered mixture while simultaneously emitting radiation at the workpiece 114 to heat the workpiece 114. Temperature measurements can be obtained until the workpiece processing is completed. The steps provided herein can be alternated or repeated in any manner depending on the desired processing parameters.

In other embodiments, it is contemplated that the workpiece 114 can be placed in the processing chamber 110 and then the workpiece 114 can be exposed to radiation, for example to heat the workpiece 114 to a certain processing or pre-processing temperature. After the workpiece 114 is exposed to radiation and achieves the desired pre-processing temperature, the workpiece 114 can be subjected to a plasma treatment process.

At (716) plasma generation is stopped, gas flow into either the plasma chamber and/or the processing chamber is stopped, and radiation emittance is stopped, thus ending workpiece processing.

At (718) the method includes removing the workpiece from the processing chamber 110. For instance, the workpiece 114 can be removed from workpiece support 112 in the processing chamber 110. The processing apparatus can then be conditioned for future processing of additional workpieces.

Further aspects of the invention are provided by the subject matter of the following clauses:

A method for processing a workpiece in a processing apparatus, the method comprising: placing the workpiece on a workpiece support comprising quartz disposed in a processing chamber; admitting one or more process gases to a plasma chamber; generating one or more species from the one or more process gases in a plasma using an inductively coupled plasma source in the plasma chamber; filtering the one or more species with one or more separation grids to create a filtered mixture containing one or more radicals; exposing the workpiece to the filtered mixture containing one or more radicals; emitting, by one or more radiative heat sources, radiation directed at one or more surfaces of a workpiece to heat at least a portion of a surface of the workpiece; and obtaining a temperature measurement indicative of a temperature of the workpiece.

The method of any preceding clause, further comprising rotating the workpiece in the processing chamber with a rotation shaft at least partially disposed in the processing chamber.

The method of any preceding clause, further comprising maintaining a vacuum pressure in the processing chamber.

The method of any preceding clause, removing gas from the processing chamber using one or more exhaust ports.

The method of any preceding clause, further comprising disposing a pumping plate around the workpiece, the pumping plate providing one or more channels for the directing a flow of process gas through the processing chamber.

The method of any preceding clause, wherein the process gas comprise an oxygen-containing gas, a hydrogen-containing gas, a nitrogen-containing gas, a hydrocarbon-containing gas, a fluorine-containing gas, or combinations thereof.

The method of any preceding clause, wherein obtaining a temperature measurement indicative of a temperature of the workpiece, comprises: emitting, by one or more emitters, calibration radiation at one or more surfaces of the workpiece; measuring, by one or more sensors, a reflected portion of the calibration radiation emitted by the one or more emitters and reflected by the one or more surfaces of the workpiece; and determining, based at least in part on the reflected portion, a first temperature measurement indicative of a temperature of the workpiece.

The method of any preceding clause, wherein the method further comprises: emitting radiation by the one or more emitters at a pulsing frequency; and isolating at least one measurement from the one or more sensors based at least in part on the pulsing frequency.

The method of any preceding clause, further comprising: blocking, by one or more windows, at least a portion of broadband radiation emitted by one or more heating lamps configured to heat the workpiece from being incident on one or more sensors.

The method of any preceding clause, comprising alternating exposing the workpiece to the filtered mixture containing one or more radicals and emitting, by one or heat sources, radiation directed at one or more surfaces of a workpiece to heat at least a portion of a surface of the workpiece.

The method of any preceding clause, comprising cooling the one or more separation grids by pumping fluid through one or more cooling channels disposed in the one or more separation grids.

The method of any preceding clause, further comprising admitting a non-process gas through one or more gas injection ports at or below the separation grid.

The method of any preceding clause, further comprising stopping plasma generation, the flow of process gas, or emitting radiation.

The method of any preceding clause, further comprising removing the workpiece from the processing chamber.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A processing apparatus for processing a workpiece, the workpiece having a top side and a back side opposite from the top side, the processing apparatus comprising:
a processing chamber;
a plasma chamber separated from the processing chamber disposed on a first side of the processing chamber;
a gas delivery system configured to deliver one or more process gases to the plasma chamber;
a plasma source configured to generate a plasma from the one or more process gases in the plasma chamber;
a workpiece support disposed within the processing chamber, the workpiece support configured to support a workpiece, the workpiece support comprising quartz, wherein the back side of the workpiece faces the workpiece support;

one or more radiative heating sources configured on a second and opposite side of the first side of the processing chamber, the one or more radiative heating sources configured to heat the workpiece from the back side of the workpiece;

a dielectric window disposed between the workpiece support and the one or more radiative heating sources;

a workpiece temperature measurement system configured at a temperature measurement wavelength range to obtain a temperature measurement indicative of a temperature of the back side of the workpiece; and a workpiece temperature control system configured to control power supply to the radiative heating sources.

2. The processing apparatus of claim 1, wherein the plasma source is an inductively-coupled plasma source.

3. The processing apparatus of claim 2, wherein a grounded Faraday shield is disposed between the inductively-coupled plasma source and the plasma chamber.

4. The processing apparatus of claim 1, wherein the plasma chamber and processing chamber are separated via one or more separation grids.

5. The processing apparatus of claim 4, wherein the one or more separation grids comprise one or more cooling channels disposed therein.

6. The processing apparatus of claim 4, further comprising one or more gas injection ports configured to inject gas between one or more separation grids.

7. The processing apparatus of claim 4, wherein the one or more separation grids are disposed such that the plasma can be filtered to create a filtered mixture in the processing chamber such that the top side of the workpiece can be exposed to the filtered mixture.

8. The processing apparatus of claim 1, wherein the dielectric window comprises quartz.

9. The processing apparatus of claim 1, wherein the dielectric window comprises one or more transparent regions that are transparent to at least a portion of radiation within the temperature measurement wavelength range and one or more opaque regions that are opaque to the portion of radiation within the temperature measurement wavelength range, wherein the one or more opaque regions are configured to block at least a portion of the broadband radiation emitted by the radiative heating sources within the temperature measurement wavelength range.

10. The processing apparatus of claim 9, wherein the dielectric window comprises quartz, and the one or more opaque regions comprise a higher level of hydroxyl (OH) groups than the one or more transparent regions.

11. The processing apparatus of claim 1, wherein the temperature measurement wavelength range comprises 2.7 micrometers.

12. The processing apparatus of claim 1, comprising a rotation system including a rotation shaft passing through the dielectric window, the rotation shaft configured to rotate the workpiece support in the processing chamber.

13. The processing apparatus of claim 12, wherein a first portion of the rotation shaft is disposed in the processing chamber and a second portion of the rotation shaft is disposed outside the processing chamber such that a vacuum pressure can be maintained in the processing chamber.

14. The processing apparatus of claim 1, further comprising a pumping plate disposed around the workpiece, the pumping plate comprising one or more channels for directing a flow of gas through the processing chamber.

15. The processing apparatus of claim 1, wherein the one or more radiative heating sources are configured to emit broadband radiation to heat the workpiece.

16. The processing apparatus of claim 1, wherein the one or more radiative heating sources are configured to emit a monochromatic radiation at a heating wavelength range, wherein the heating wavelength range is different from the temperature measurement wavelength range.

17. The processing apparatus of claim 1, wherein the workpiece temperature measurement system is configured to obtain a reflectance measurement of the workpiece.

18. The processing apparatus of claim 17, wherein the workpiece temperature measurement system comprises:
one or more emitters configured to emit a calibration radiation within the temperature measurement wavelength range; and
one or more sensors, wherein at least a portion of the calibration radiation emitted from the one or more emitters is reflected by the workpiece and collected by the one or more sensors.

19. The processing apparatus of claim 18, wherein the emitter emits the calibration radiation onto the workpiece with a modulation in intensity.

20. The processing apparatus of claim 1, wherein the temperature measurement system comprises a first pyrometer and a second pyrometer, wherein the first pyrometer is disposed so as to take the temperature measurement of the workpiece about a center of the workpiece and the second pyrometer is disposed so as to take the temperature measurement of the workpiece about a perimeter of the workpiece.

* * * * *